(12) United States Patent
Yoon

(10) Patent No.: US 6,489,201 B2
(45) Date of Patent: Dec. 3, 2002

(54) METHOD FOR MANUFACTURING A SEMICONDUCTOR DEVICE

(75) Inventor: Byoung-Moon Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/021,991

(22) Filed: Dec. 13, 2001

(65) Prior Publication Data

US 2002/0090784 A1 Jul. 11, 2002

(30) Foreign Application Priority Data

Jan. 6, 2001 (KR) ................................................. 01-822

(51) Int. Cl.[7] ............................................. A01L 21/336
(52) U.S. Cl. ........................ 438/257; 438/261; 438/672
(58) Field of Search ................................. 438/257, 258, 438/259, 261, 266, 282, 672

(56) References Cited

U.S. PATENT DOCUMENTS 5,879,986 A * 3/1999 Sung ........................... 438/253
6,037,216 A * 3/2000 Liu et al. ..................... 438/253
6,096,595 A * 8/2000 Huang ......................... 438/238
6,124,192 A * 9/2000 Jeng et al. ................... 438/597
6,127,260 A * 10/2000 Huang ......................... 438/629

* cited by examiner

Primary Examiner—John F. Niebling
Assistant Examiner—Lynne Gurley
(74) Attorney, Agent, or Firm—Mills & Onello LLP

(57) ABSTRACT

Disclosed is a method for manufacturing a semiconductor device. A polysilicon layer is deposited on an oxide layer having a contact hole or an opening. The polysilicon layer is etched-back such that the polysilicon layer remains only in the contact hole or in the opening. A cleaning process is performed using a first etchant having a similar etching rate with respect to polysilicon and oxide, thereby removing a damaged layer which is created on a surface of the oxide layer when the etch back process is carried out with respect to the polysilicon layer. An insulating layer is deposited on the resulting structure. After the etch-back process is carried out, a cleaning process using SC-1 solution is performed so as to remove the damaged layer formed on a surface of a lower insulating layer. A polysilicon based plate-shaped defect can be prevented and a lateral undercut of an upper insulating layer can be reduced when a subsequent HF cleaning process is carried out.

11 Claims, 11 Drawing Sheets

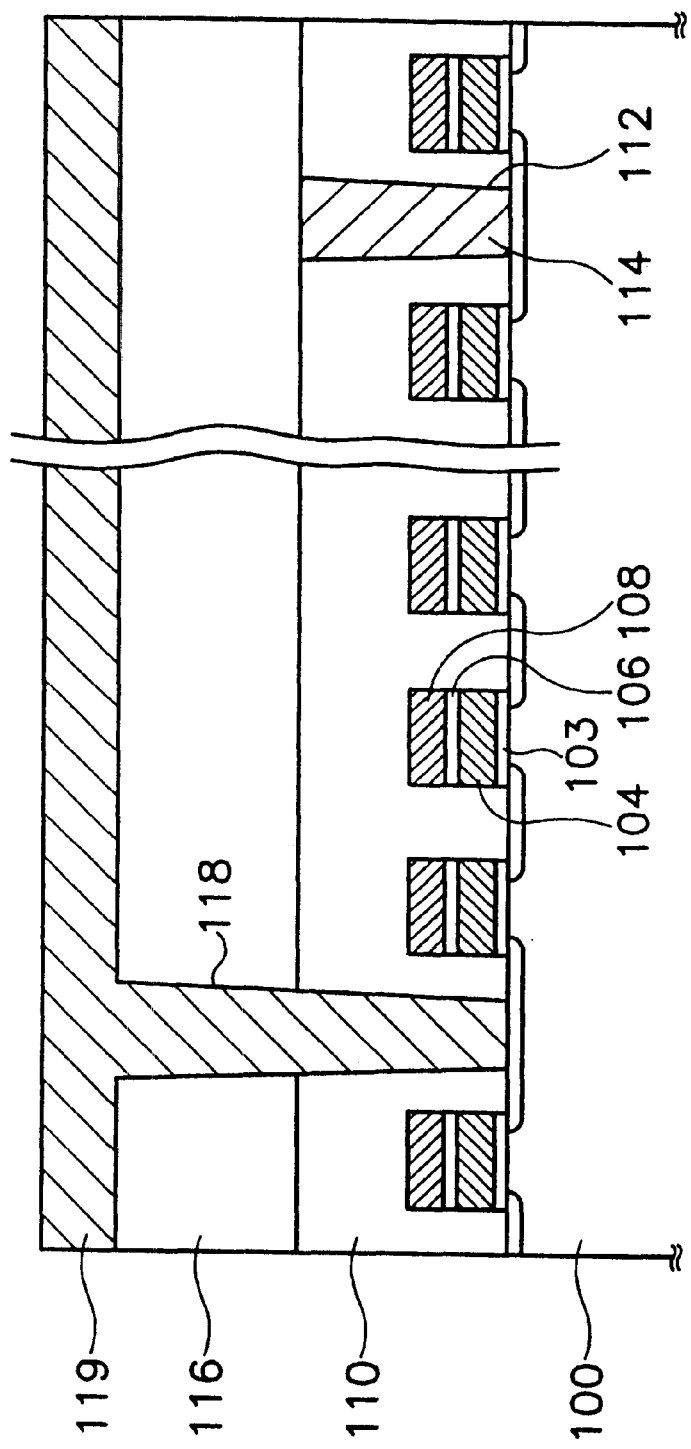

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for manufacturing a semiconductor device by using a dual-damascene process in which a wiring is formed while simultaneously filling a contact hole.

2. Description of the Related Art

As multi-layer wiring structures are more widely used in semiconductor memory devices, the aspect ratio of contact holes, i.e., the ratio of the diameter of the hole to its depth, increases so that various kinds of problems, such as a non-planar phenomenon, poor step coverage, shorts caused by residual metal, low yield rate, reduced reliability and the like, occur. In order to solve the above problems, a damascene process has been suggested as a new wiring technique. According to the damascene process, a trench (or a hole) is formed by partially etching an insulating layer, and a conductive layer is deposited such that the trench is completely filled. Excess insulating layer remaining on the insulating layer is removed by performing chemical mechanical polishing (CMP) process thereby forming a wiring in the trench.

In the damascene process, the wiring is engraved in a trench area of the insulating layer. The wiring is mainly formed as a line and space pattern. Recently, a damascene process for forming the wiring while simultaneously filling up a via hole or a contact hole is widely used.

A flash memory device is a kind of an EEPROM (electrically-erasable programmable read only memory) which can electrically erase data at high speed. The flash memory device electrically controls the input and output of data by using an F-N (Fowler-Nordheim) tunneling effect or hot electron injection.

Flash memory devices are typically of the NAND type, in which a plurality of cell transistors are connected in series to form a unit string and the unit strings are connected between a bit line and a ground line in a row, or the NOR type, in which each cell transistor is connected between the bit line and the ground line in a row. The NOR type is adapted for high-speed operation and the NAND type is adapted for high integration.

FIGS. 1A to 1E are sectional views showing a method for manufacturing a NAND type flash memory using a conventional dual-damascene process. Referring to FIG. 1A, an oxide material is deposited on a semiconductor substrate (not shown) formed with cell transistors having a stacked gate structure and selecting-transistors having a MOS transistor structure, thereby forming an insulating interlayer 16. Then, the insulating interlayer 16 is etched by performing a photolithography process so that a bit line contact hole 18 is formed. A doped polysilicon layer is deposited on the bit line contact hole 18 and the insulating interlayer 16. Then, a plasma dry etching process is carried out so as to etch-back the polysilicon layer to expose a surface of the insulating interlayer 16, thereby forming a bit line plug 20 in the bit line contact-hole 18.

By performing the plasma etching process, gas in a plasma state is dissociated into ions, electrons and active radicals. The ions, electrons and active radicals are combined with atoms existing in an etching area of the semiconductor substrate and disappear from the surface of the semiconductor substrate while creating new materials. At this time, a local charging occurs at the surface of the insulating interlayer 16 caused by the isotropic flux feature of electrons and the directional flux feature of ions in a plasma sheath, so a damaged layer 21 is formed.

Referring to FIG. 1B, silicon oxynitride (SiON) is deposited on the bit line plug 20 and the insulating interlayer 16 by using a plasma-enhanced chemical vapor deposition (PE-CVD) process, thereby forming an etching stop layer 22. Then, TEOS is deposited on the etching stop layer 22 by using the PE-CVD process to form a bit line insulating layer 24.

Referring to FIG. 1C, a bit line insulating layer pattern 25 and an etching stop layer pattern 23 are formed by etching the bit line insulating layer 24 and the etching stop layer 22 using a photolithography process. The bit line insulating layer pattern 25 isolates adjacent bit lines from each other, and is patterned in the same direction as in the bit line. That is, a bit line wiring area 26 is defined between insulating layer patterns 25.

Referring to FIG. 1D, after exposing the active area formed at a peripheral portion of a memory cell using the photolithography process, the exposed insulating interlayer 16 is etched so as to form a metal contact hole 28.

Referring to FIG. 1E, after performing a cleaning process using hydrofluoric acid (HF) for removing a native oxide film remaining on the bit line plug 20, a barrier metal layer 30 made of titanium/titanium nitride (Ti/TiN) is deposited on the bit line plug 20, the metal contact hole 28, the bit line insulating layer pattern 25 and the insulating interlayer 16. Then, a tungsten layer 32 having a thickness sufficient for filling up the bit line wiring area 26 and the metal contact hole 28 is deposited on the barrier metal layer 30.

Thereafter, though it is not illustrated, a bit line connected to the bit line plug 20 and a metal wiring layer for filling up the metal contact hole 28 are formed by removing the tungsten layer 32 to expose the surface of the bit line insulating layer pattern 25 by using the CMP process.

According to the above-mentioned conventional method, when the etch back process is carried out, a plate-shaped defect at an edge of a wafer (shown in FIG. 2) is shifted into an inner portion of the wafer so that an error occurs when the photolithography process is carried out. The plate-shaped defect mainly occurs at a fixing portion of the wafer to which a chuck is coupled and a bevel portion of the wafer. The plate-shaped defect, which occurs when the polysilicon etch back process is carried out, is assumed as having occurred at a polysilicon type material. Accordingly, if the plate-shaped defect remains in the wafer, the bit line insulating layer pattern 25 cannot be properly formed in the subsequent process or the metal contact hole 28 cannot be opened.

In addition, the damaged layer 21 is formed on the surface of the insulating interlayer 16 by the polysilicon etch back process and the etching stop layer 22 made of silicon oxynitride is stacked on the damage layer 21. Therefore, when the HF cleaning process is carried out before the barrier metal layer 28 is deposited, a lateral undercut (circle A of FIG. 1E) of the etching stop layer pattern 23 increases at an interfacial surface between the etching stop layer pattern 23 and the insulating interlayer 16. Sometimes, the etching stop layer pattern 23 is lifted so that the bit line insulating layer pattern 25 falls down.

SUMMARY OF THE INVENTION

To solve the above problems of the prior art, it is a first object of the present invention to provide a method for manufacturing a semiconductor device capable of preventing a plate-shaped defect generated during a polysilicon etch back process and solving a lateral undercut problem of an upper insulating layer.

A second object of the present invention is to provide a method for fabricating a non-volatile memory device capable of forming a bit line while simultaneously filling up a metal contact hole and capable of preventing a plate-shaped defect generated during an etch back process of polysilicon for a bit line plug and solving a lateral undercut problem of an upper insulating layer.

In accordance with the invention, there is provided a method for manufacturing a semiconductor device. In accordance with the method of the invention, a polysilicon layer is deposited on an oxide layer having a contact hole or an opening. The polysilicon layer is etched back such that the polysilicon layer remains only in the contact hole or in the opening. A cleaning process is performed using a first etchant having a similar etching rate with respect to polysilicon and oxide, thereby removing a damaged layer which is created on a surface of the oxide layer when the etch back process is carried out with respect to the polysilicon layer. An insulating layer is deposited on the resulting structure.

In one embodiment, the first etchant has an etching ratio of 1:1 to 1:1.5 with respect to polysilicon and oxide. The first etchant can include a solution comprising $NH_4OH$, $H_2O_2$ and $H_2O$ which are mixed in a ratio of about 1:4:20.

In one embodiment, the insulating layer is a composite layer including a nitride-based material layer and an oxide-based material layer.

In one embodiment, after the insulating layer is deposited on the structure, an insulating layer pattern is formed by etching the insulating layer, and a cleaning process is performed using a second etchant. The second etchant can include a diluted HF solution in which HF is diluted in a ratio of about 200:1.

In another aspect, the invention is directed to a method for fabricating a non-volatile memory device. In accordance with the method, an insulating interlayer made of oxide is deposited on a semiconductor substrate on which a plurality of active areas defined by a field area extend in a first direction and a plurality of word lines extending in a second direction are formed on the active areas. A plurality of bit line contact holes are formed to expose first regions of the active areas by partially etching the insulating interlayer. A polysilicon layer is deposited on the resulting structure, and the polysilicon layer is etched back, thereby forming bit line plugs in the bit line contact holes. A first cleaning process is performed using a first etchant having a similar etching rate with respect to polysilicon and oxide thereby removing a damaged layer which is created on a surface of the insulating interlayer when the etch back process is carried out with respect to the polysilicon layer. An etching stop layer and a bit line insulating layer are deposited on the structure. The etching stop layer and the bit line insulating layer are etched to form a plurality of bit line insulating layer patterns and etching stop layer patterns which extend in the first direction and to define a bit line wiring area between adjacent bit line insulating layer patterns. A plurality of metal contact holes are formed to expose second regions of the active areas by etching the insulating interlayer. A second cleaning process is performed using a second etchant, thereby removing a native oxide layer from a surface of the bit line plug. A metal layer is deposited on the resulted structure, and the metal layer is removed until the bit line insulating layer pattern is exposed by using a chemical mechanical polishing process, at the same time, forming a metal wiring for filling up the metal contact hole.

In one embodiment, the first etchant has an etching ratio of 1:1 to 1:1.5 with respect to polysilicon and oxide. The first etchant can include a solution comprising $NH_4OH$, $H_2O_2$ and $H_2O$ which are mixed in a ratio of about 1:4:20.

The first cleaning process using the first etchant can be carried out for about 20 to 30 minutes. The second etchant can include a diluted HF solution in which HF is diluted in a ratio of about 200:1. The insulating interlayer can include high-density plasma oxide. The bit line insulating layer can include a material having an etching rate different from an etching rate of a material of the etching stop layer with respect to a predetermined etching process. The etching stop layer can include a nitride based material and the bit line insulating layer can include an oxide-based material.

In one embodiment, before the metal layer is deposited, a barrier metal layer is deposited on the bit line insulating layer pattern, the bit line plug, the insulating interlayer, and the metal contact hole. The barrier metal layer can be comprised of titanium/titanium nitride (Ti/TiN). The metal layer can be comprised of tungsten.

According to the present invention, a polysilicon based plate-shaped defect can be removed from an edge of a wafer by carrying out a cleaning process using an etchant, such as SC-1, after the etch- back process has been finished. At the same time, the damage layer formed at a lower insulating layer is removed, so the lateral undercut of an upper insulating layer can be reduced when a subsequent cleaning process is carried out.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIGS. 5A to 5H are sectional views taken along the line B–B' of FIG. 3 showing a method for manufacturing the NAND type flash memory device according to one embodiment of the present invention.

DETAILED DESCRIPTION OF THE PREFERRED EMBODIMENTS

Figure 1A:
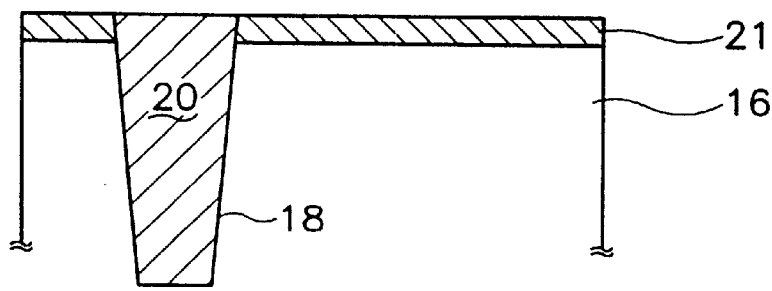
FIGS. 1A to 1E are sectional views showing a method for manufacturing a NAND type flash memory device using a conventional dual-damascene process.
Figure 1B:
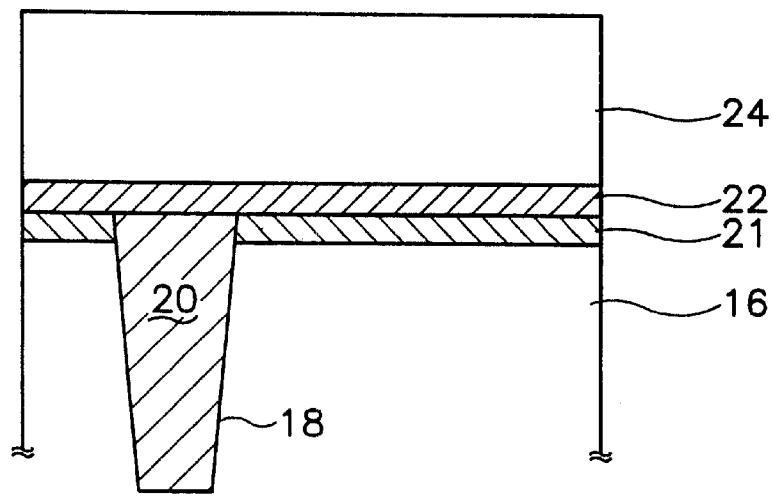
Figure 1C:
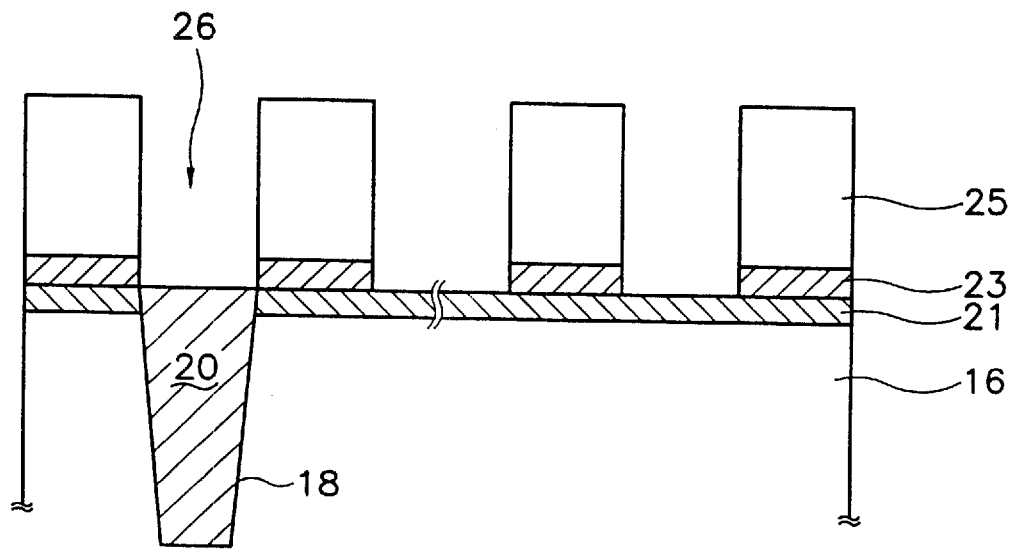
Figure 1D:
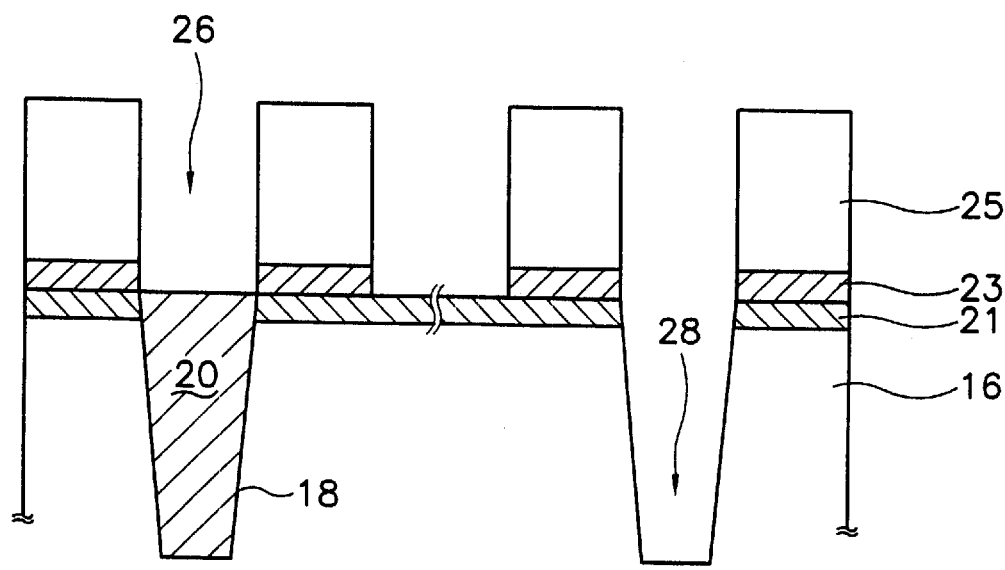
Figure 1E:
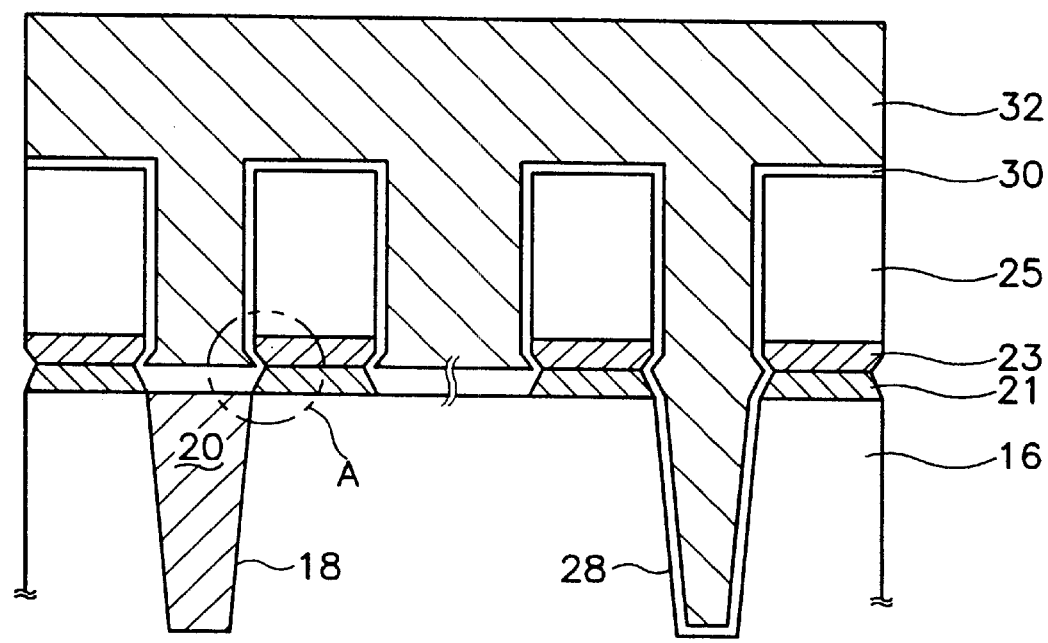
Figure 2:
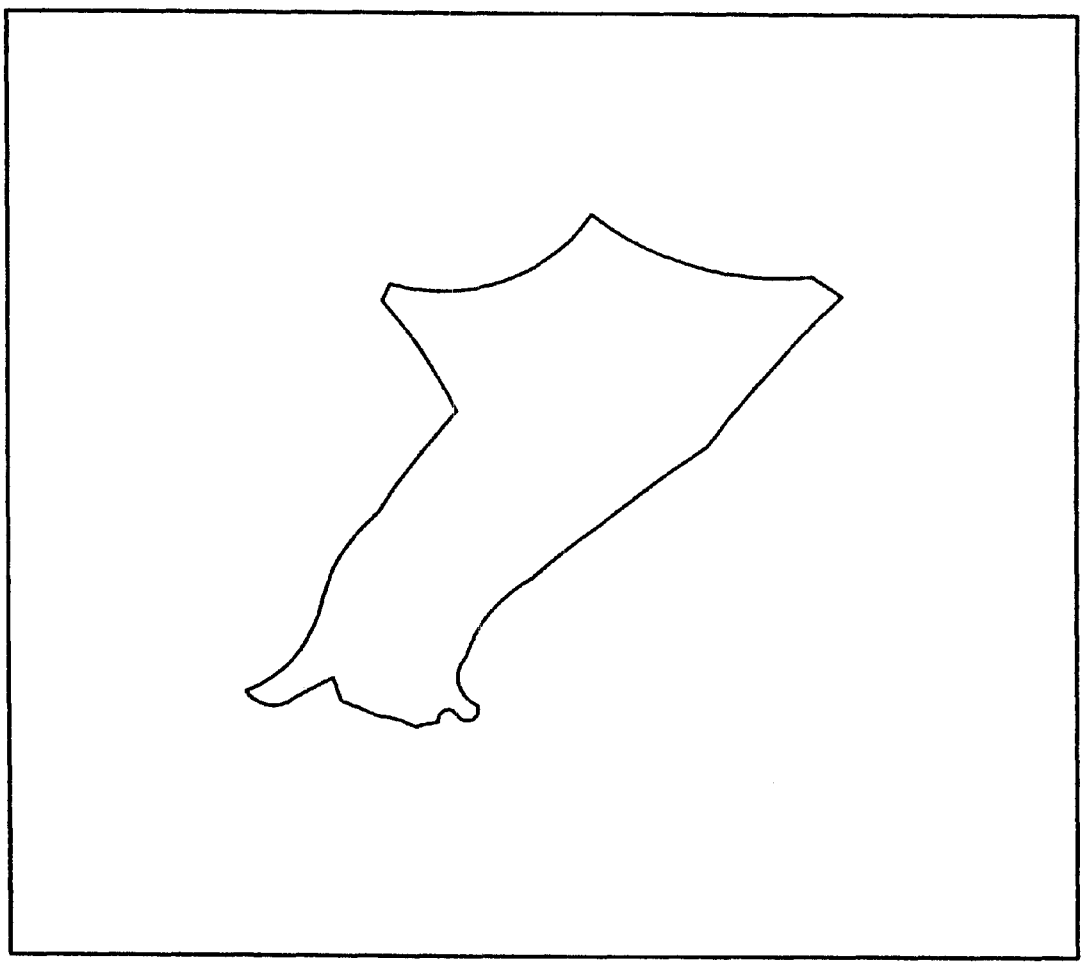
FIG. 2 is a plan view showing a plate-shaped defect created at an edge of a wafer.
Figure 3:
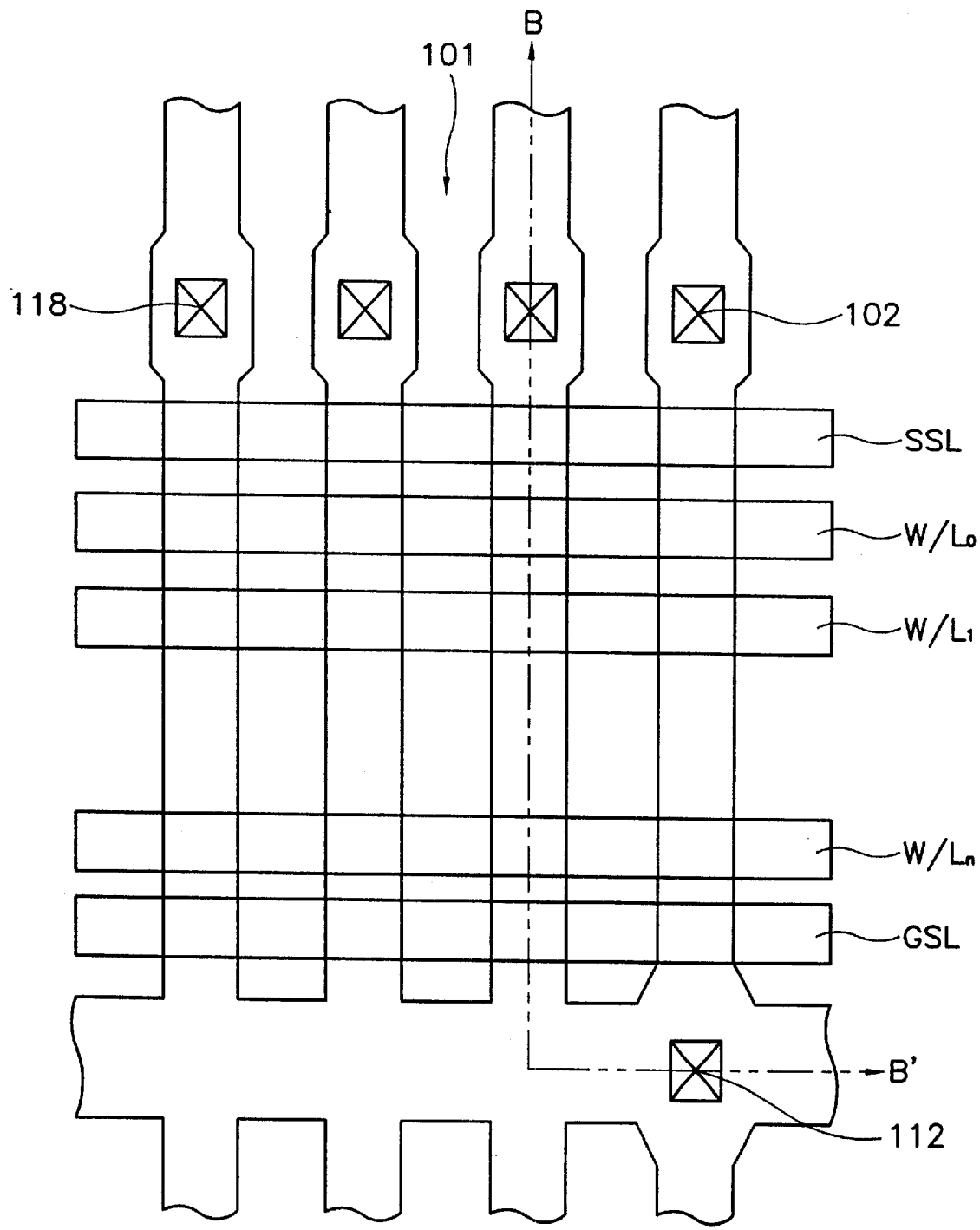
FIG. 3 is a layout view showing a NAND type flash memory cell manufactured according to one embodiment of the present invention.
Figure 4:
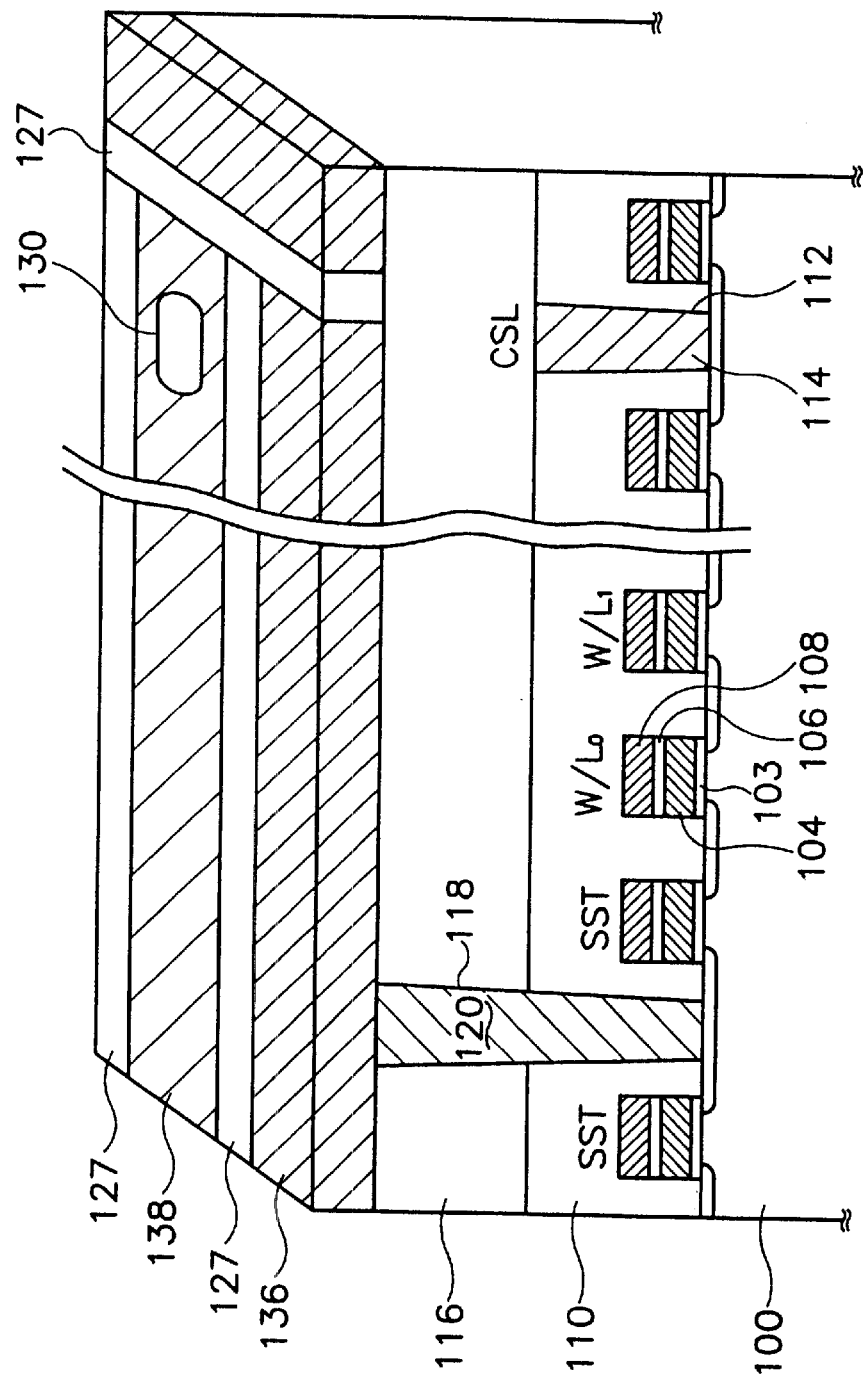
FIG. 4 is a perspective view of the NAND type flash memory cell shown in FIG. 3.

FIG. 3 is a layout view showing a NAND type flash memory cell manufactured according to one embodiment of the present invention, and FIG. 4 is a perspective view of the NAND type flash memory cell.

Referring to FIGS. 3 and 4, the NAND type flash memory cell comprises a plurality of cell transistors which are connected between a bit line contact hole 118 and a common source line CSL in series so as to form a string. The strings are connected to each other in a row to form a block. The blocks are symmetrically arranged about the bit line contact hole 118.

Active areas 102, on which a source/drain of the cell transistor is formed, are separated from each other by field areas 101 and extend in a first direction parallel to the field areas 101. A plurality of word lines $W/L_0, W/L_1, \ldots, W/L_n$ are formed in the active areas 102 perpendicular to the active areas 102. The word lines are spaced from each other by a predetermined distance.

A string select line SSL and a ground select line GSL, which respectively form a select transistor, are provided at outsides of the first word line $W/L_0$ and $n_{th}$ word line $W/L_n$ in one string. A bit line 136 extending in the same direction with the active areas 102 is connected to a drain of a string select transistor SST. The common source line CSL is connected to a source of a ground select transistor GST. The common source line CSL is connected to a common source area through a common source contact hole 112. The common source area is connected to the source area of each transistor through a metal wiring layer 138.

The cell transistor has a stacked type gate structure consisting of a floating gate 104 which is formed on a semiconductor substrate 100 by interposing a tunnel oxide layer (that is, a gate oxide layer 103), and a control gate 108 which is formed on the floating gate 104 by interposing a dielectric layer 106. Generally, the floating gate 104 is made of polysilicon and the control gate 108, which is provided as a word line, has a stacked polycide structure of polysilicon and tungsten silicide.

The string select transistor SST does not require the floating gate for storing data, so the floating gate is connected to the control gate 108 by a metal link through a butting contact in the field area 101 of the memory cell area. Accordingly, the string select transistor SST electrically acts as a MOS transistor having a single layer gate.

Figure 5B:
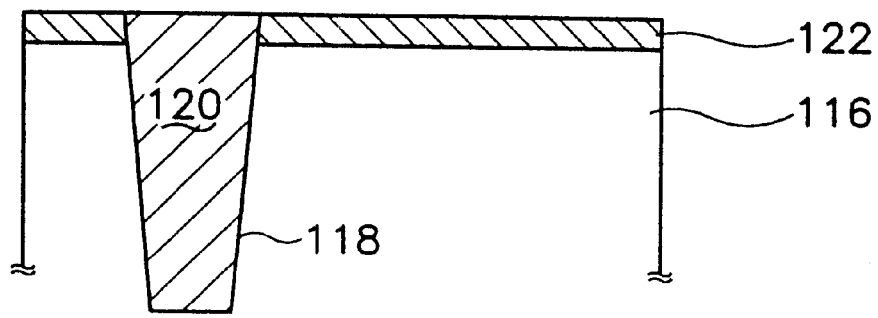

FIGS. 5A to 5H are sectional views taken along the line B–B' of FIG. 3 illustrating a method for manufacturing the NAND type flash memory device. FIG. 5A shows the step of forming a bit line contact hole 120. The field areas 101 (shown in FIG. 3) are formed in the semiconductor 100 through a shallow trench isolation (STI) process so as to define active areas 102 (shown in FIG. 3). Then, the tunnel oxide layer 103 is formed on the active areas 102 by a thermal oxidizing process. In order to form the oxide layers of the select transistors having a different thickness than the oxide layer of the cell transistors, a gate oxide layer is grown on the semiconductor substrate 100, and then, the gate oxide layer in the cell transistor area is removed by a wet-etching process before the tunnel oxide layer 103 is formed.

Then, after depositing a first conductive layer used for floating gates of the cell transistors on the resulting structure, the first conductive layer formed in the field areas 102 is partially etched by a photolithography process. After forming a dielectric layer, such as an ONO layer, on the first conductive layer, a second conductive layer used for control gates of the cell transistors is deposited thereon. The memory cell area is opened (exposed) by performing the photolithography process. Then, the second conductive layer, the dielectric layer and the first conductive layer are dry-etched by using a self-aligned etching process, so that the stacked type gates of the cell transistors having the floating gates 104, the dielectric layers and the control gates 108 are formed. At the same time, gates of the string select transistors SST and the ground select transistors GST are formed. The floating gates 104 and the control gates 108 of the select transistors are electrically connected to each other through the butting contact, thereby forming the single layer gate.

Then, after forming source/drain areas (not shown) of the cell transistors and the select transistors by using an ion implantation process, an insulating layer 110 is deposited on the resulting structure. A common source contact hole 112 for exposing a common source area in the active areas 102 is formed by etching the insulating layer 110 using the photolithography process. In addition, a common source plug 114 made of doped polysilicon is formed in the common source contact hole 112.

Then, an oxide based insulating material is deposited on the insulating layer 110 and the common source plug 114 to a thickness of 5000 Å, thereby forming the insulating interlayer 116. Preferably, the insulating interlayer 116 comprised of an HDP oxide layer is formed by generating high-density plasma. In one embodiment, $SiH_4$, $O_2$ and Ar gases are used as a plasma source gas.

Next, the insulating interlayer 116 is etched by means of a photolithography process so that the bit line contact hole 118 for exposing the first region of the active areas, that is, a drain area formed between the string select transistors. Then, a doped polysilicon layer 119 is formed on the bit line contact hole 118 and the insulating interlayer 116 to a thickness of 2000 Å using a low pressure chemical vapor deposition (LPCVD) process.

Hereinafter, the present invention will be explained with reference to FIGS. 5B to 5H. In the FIGS. 5B to 5H, the lower transistor is not illustrated for the purpose of convenience.

FIG. 5B shows the step of forming the bit line plug 120 in the bit line contact hole 118 by etching back the polysilicon layer 119 to expose the surface of the insulating interlayer 116 by means of a plasma dry etching process. At this time, due to the feature of the plasma etching process, a damaged layer 122 is formed on the surface of the insulating interlayer 116 to a thickness of 100 Å. In addition, though it is not illustrated, a polysilicon based plate-shaped defect is created at edges of the wafer, that is a fixing portion of wafer to which a wafer chuck is coupled and a bevel portion of the wafer.

Figure 5C:
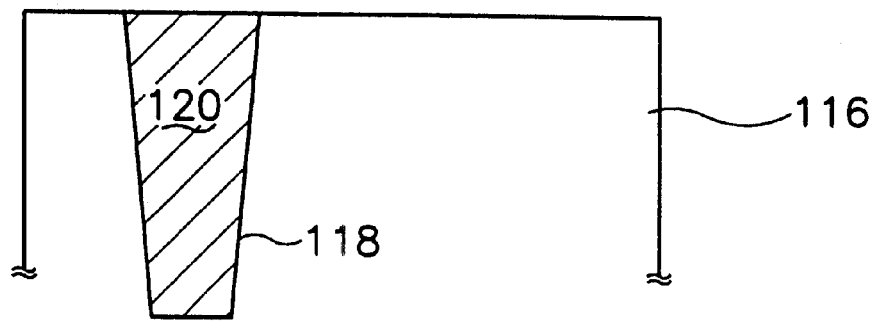

FIG. 5C shows the step of cleaning the structure using a first etchant having a similar etching rate with respect to polysilicon and oxide. As a result, the insulating interlayer made of oxide is etched by a predetermined amount so that the damage layer 122 is removed. At the same time, the polysilicon based plate-shaped defect is removed.

The first etchant has an etching rate in the ratio of about 1:1 to 1:1.5 with respect to polysilicon and oxide. Preferably, SC-1 (standard cleaning-1) solution including $NH_4OH$, $H_2O_2$ and $H_2O$, which are mixed in a ratio of 1:4:20, is used as the first etchant. The cleaning process using the first etchant is carried out for about 20 to 30 minutes in such a manner that polysilicon and oxide are etched in the range of 60 to 120 Å so as to completely remove the damaged layer 122 and the plate-shaped defect.

Generally, when the SC-1 solution is used as the first etchant, polysilicon and oxide are etched by 30 to 40 Å per 10 minutes.

Figure 5D:
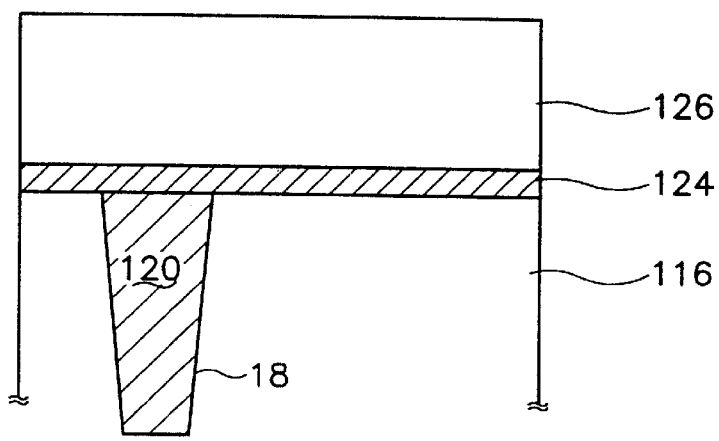

FIG. 5D shows the step of depositing the etching stop layer 124 and the bit line insulating layer 126. An etching stop layer 124 is formed by depositing silicon oxynitride (SiON) on the insulating interlayer 116 and the bit line plug 120, on which the damaged layer 122 is removed. At this time, silicon oxynitride (SiON) is deposited to a thickness of 600 Å by means of the PE-CVD process. Then, a bit line insulating layer 126 is formed by depositing TEOS on the etching stop layer 124 to a thickness of 2000 to 3000 Å by means of the PE-CVD process.

Figure 5E:
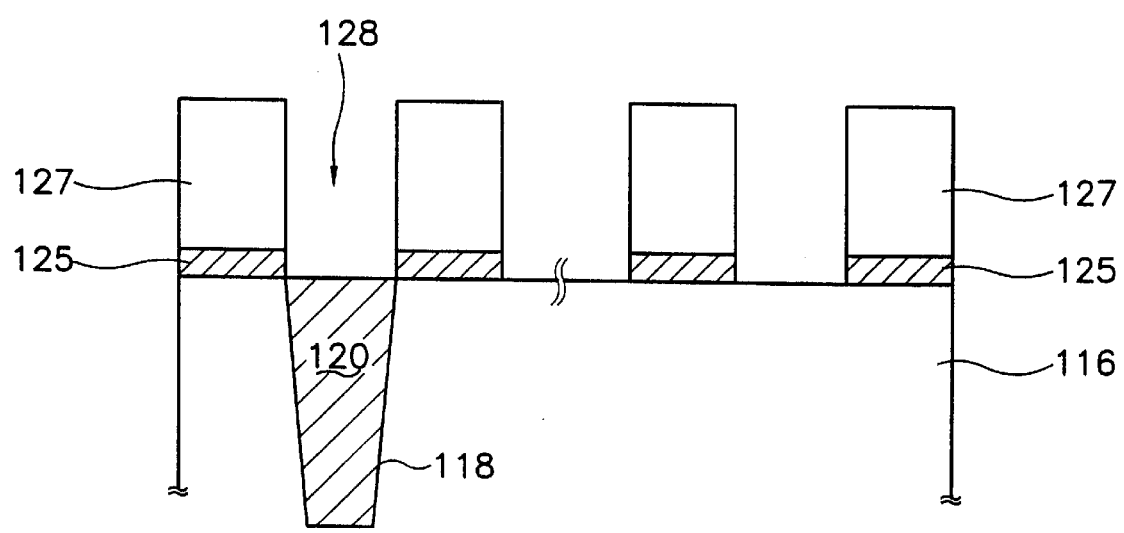

FIG. 5E shows the step of forming a bit line insulating layer pattern 127 and an etching stop layer pattern 125 by etching the bit line insulating layer 126 and the etching stop layer 124 by means of the photolithography process. The bit line insulating layer pattern 127 insulates adjacent bit lines and is patterned in the same direction with the bit line. That is, a bit line wiring area 128 is defined between adjacent bit line insulating layer patterns 127.

Figure 5F:
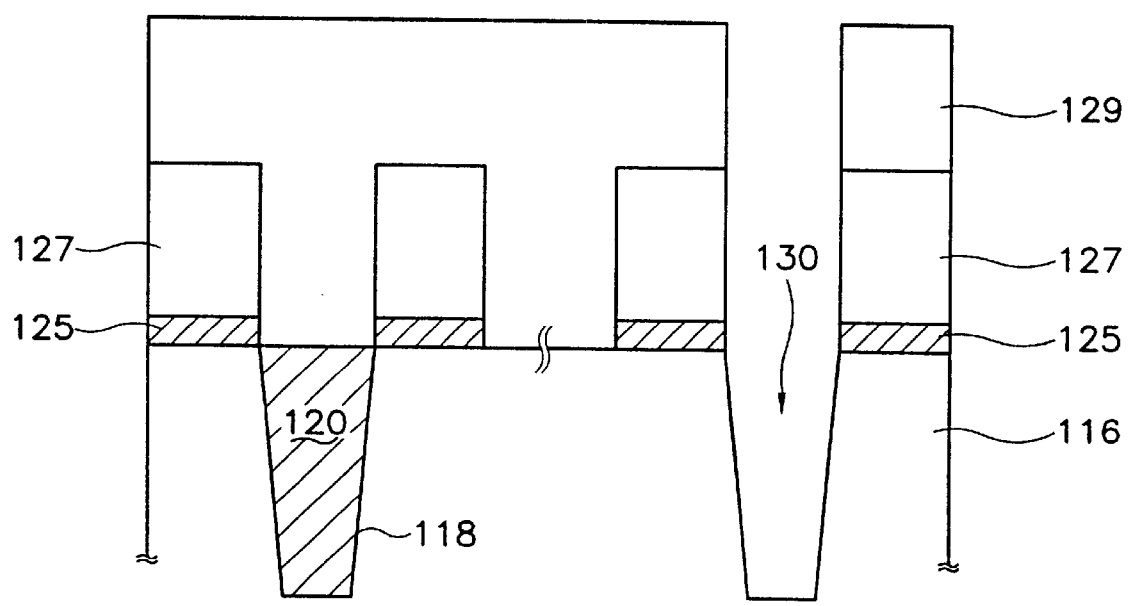

FIG. 5F shows the step of forming a metal contact hole. After coating a photoresist film on the bit line insulating layer pattern 127, the bit line plug, and the insulating interlayer 116, the photoresist film is exposed and developed so that a photoresist pattern 129 for defining a metal contact hole area is formed.

Then, the second region of the active area positioned at an outer portion of the memory cell is etched by using the photoresist pattern 129 as an etching mask, thereby forming the metal contact hole 130. At the same time, the metal contact hole 130 is formed on the common source plug 114.

Figure 5G:
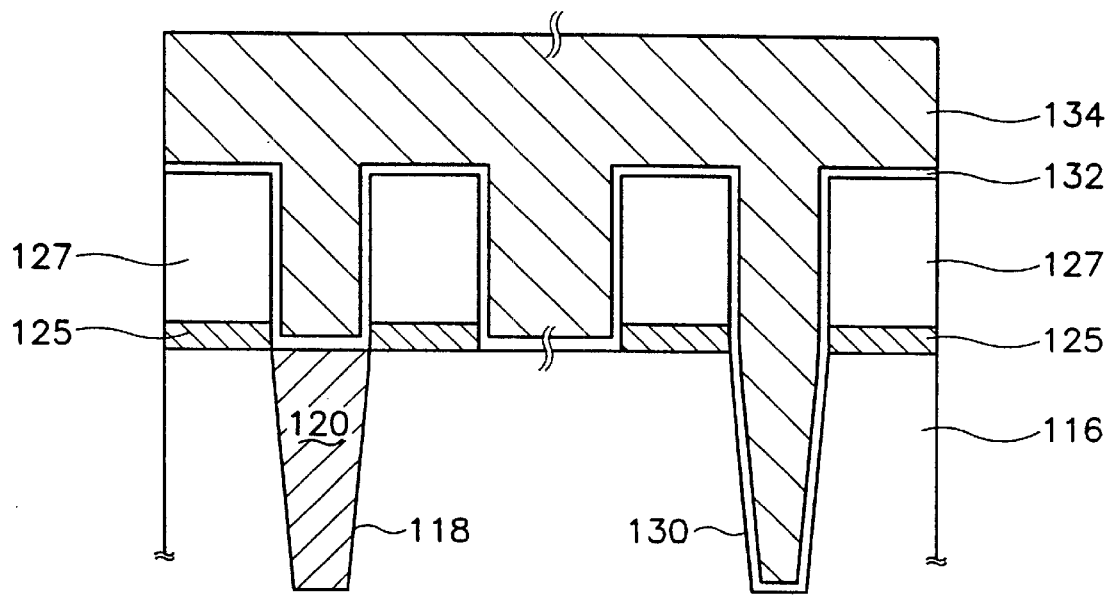

FIG. 5G shows the step of depositing a barrier metal layer 132 and a tungsten layer 134. After removing the photoresist pattern 129 by performing ashing and stripping processes, the resulting structure formed with the contact hole 130 is subject to a cleaning process for about 60 seconds so as to remove the native oxide layer formed on the bit line plug 120. At this time, a second etchant, such as a mixed chemical (a diluted HF solution) having HF and ultra-pure water in the ratio of about 1:200, is applied to the resulting structure. According to the present invention, the HF cleaning process is carried out after removing the damage layer 122 from the surface of the insulating interlayer 116, the lateral undercut of the etching stop layer pattern 125 can be reduced at an interfacial surface between the etching stop layer pattern 125 and the insulating interlayer 116.

Then, the barrier metal layer 132 is formed continuously on the bit line insulating layer pattern 127, the bit line plug 120, the insulating interlayer 116 and the metal contact hole 130. Preferably, titanium (Ti) is deposited to a thickness of 200 Å by means of the CVD process or a sputtering process and titanium nitride (TiN) is deposited thereon to a thickness of 500 Å to form the barrier metal layer 132.

Thereafter, the tungsten layer 134 is deposited on the barrier metal layer 132 such that the bit line wiring area 128 and the metal contact hole 130 are sufficiently filled up.

Figure 5H:
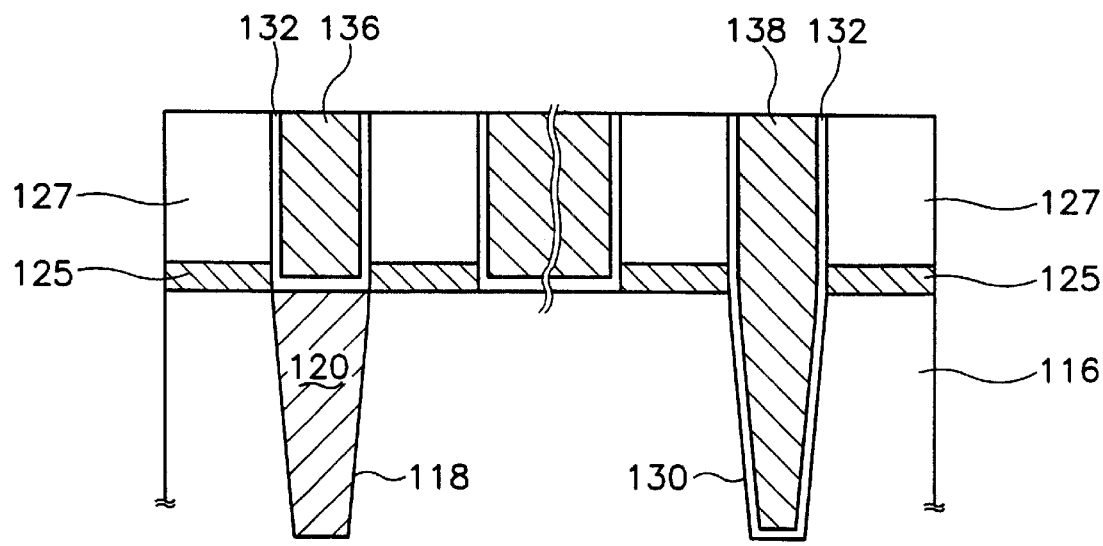

FIG. 5H shows the step of forming the bit line 136 and the metal wiring layer 138. The tungsten layer 134 is removed by means of the CMP process until the surface of the bit line insulating layer 127 is exposed. Accordingly, the bit line 136 is formed in the bit line wiring area 128 and the metal wiring layer 138 is formed in the metal contact hole area. The bit line 136 is connected to a drain area formed between the string select transistors through the bit line plug 120. The metal wiring layer 138 is connected to the second region of the active area, that is a gate of the transistor and the common source plug 114, through the metal contact hole 130.

As mentioned above, according to the present invention, the cleaning process is carried out using SC-1 solution after the polysilicon layer is etched back, so the polysilicon based plate-shaped defect formed at edges of the wafer is removed. At the same time, the damaged layer formed on the surface of the lower insulating layer can be removed, so the lateral undercut of the upper insulating layer can be reduced when the following cleaning process is carried out.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A method for fabricating a non-volatile memory device, the method comprising the steps of:

i) depositing an insulating interlayer of oxide on a semiconductor substrate on which a plurality of active areas defined by a field area extend in a first direction and a plurality of word lines extending in a second direction are formed on the active areas;

ii) forming a plurality of bit line contact holes for exposing first regions of the active areas by etching the insulating interlayer;

iii) depositing a polysilicon layer and etching-back the polysilicon layer thereby forming bit line plugs in the bit line contact holes;

iv) performing a first cleaning process using a first etchant having a similar etching rate with respect to polysilicon and oxide thereby removing a damaged layer which is created on a surface of the insulating interlayer when the etch back process is carried out with respect to the polysilicon layer;

v) sequentially depositing an etching stop layer and a bit line insulating layer;

vi) etching the etching stop layer and the bit line insulating layer to form a plurality of bit line insulating layer patterns and etching stop layer patterns which extend in the first direction and defining a bit line wiring area between adjacent bit line insulating layer patterns;

vii) forming a plurality of metal contact holes for exposing second regions of the active areas by etching the insulating interlayer;

viii) performing a second cleaning process using a second etchant, thereby removing a native oxide layer from a surface of the bit line plug; and ix) depositing a metal layer on the resulting structure and removing the metal layer until the bit line insulating layer pattern is exposed using a chemical mechanical polishing process, at the same time, forming a metal wiring for filling the metal contact hole.

2. The method as claimed in claim 1, wherein the first etchant has an etching ratio of about 1:1 to 1:1.5 with respect to polysilicon and oxide.

3. The method as claimed in claim 1, wherein the first etchant includes a solution comprising $NH_4OH$, $H_2O_2$ and $H_2O$ which are mixed in a ratio of about 1:4:20.

4. The method as claimed in claim 1, wherein the first cleaning process using the first etchant is carried out for about 20 to 30 minutes.

5. The method as claimed in claim 1, wherein the second etchant includes a diluted HF solution in which HF is diluted in a ratio of about 200:1.

6. The method as claimed in claim 1, wherein the insulating interlayer is comprised of high-density plasma oxide.

7. The method as claimed in claim 1, wherein the bit line insulating layer is comprised of a material having an etching rate different from an etching rate of a material of the etching stop layer with respect to a predetermined etching process.

8. The method as claimed in claim 7, wherein the etching stop layer is comprised of a nitride based material and the bit line insulating layer is comprised of an oxide-based material.

9. The method as claimed in claim 1, wherein, before the metal layer is deposited, a barrier metal layer is deposited on the bit line insulating layer pattern, the bit line plug, the insulating interlayer, and the metal contact hole.

10. The method as claimed in claim 9, wherein the barrier metal layer is comprised of titanium/titanium nitride (Ti/TiN).

11. The method as claimed in claim 1, wherein the metal layer is comprised of tungsten.

* * * * *